(12) United States Patent
Verschuren et al.

(10) Patent No.: US 12,374,577 B2
(45) Date of Patent: Jul. 29, 2025

(54) SUBSTRATE RESTRAINING SYSTEM

(71) Applicant: ASML Netherlands B.V., Veldhoven (NL)

(72) Inventors: Marinus Augustinus Christiaan Verschuren, Helmond (NL); Thomas Poiesz, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 42 days.

(21) Appl. No.: 18/547,470

(22) PCT Filed: Feb. 3, 2022

(86) PCT No.: PCT/EP2022/052542
§ 371 (c)(1),
(2) Date: Aug. 22, 2023

(87) PCT Pub. No.: WO2022/184366
PCT Pub. Date: Sep. 9, 2022

(65) Prior Publication Data
US 2024/0136218 A1    Apr. 25, 2024
US 2024/0234196 A9    Jul. 11, 2024

(30) Foreign Application Priority Data

Mar. 2, 2021 (EP) .................................. 21160262

(51) Int. Cl.
*H01L 21/687* (2006.01)
*C23C 14/50* (2006.01)
(Continued)

(52) U.S. Cl.
CPC ........ *H01L 21/68721* (2013.01); *C23C 14/50* (2013.01); *G03F 7/70708* (2013.01); *H01L 21/67028* (2013.01); *H01L 21/6833* (2013.01)

(58) Field of Classification Search
CPC ..... C23C 14/50; C23C 14/546; H01L 21/687; H01L 21/68714; H01L 21/21; H01L 21/68721
See application file for complete search history.

(56) References Cited

U.S. PATENT DOCUMENTS

2007/0187235 A1 * 8/2007 Hsiao ...................... C23C 14/50
                                                              118/728
2009/0079525 A1    3/2009 Sijben
2009/0107836 A1    4/2009 Rash et al.

FOREIGN PATENT DOCUMENTS

CN    110832399 A  *  2/2020  ......... G03F 7/70908
EP    0 349 364 A1 *  1/1990  ............. C30B 25/12
(Continued)

OTHER PUBLICATIONS

Translation to JP 2009-272464 published Nov. 2009.*
(Continued)

*Primary Examiner* — John J Brayton
(74) *Attorney, Agent, or Firm* — Sterne, Kessler, Goldstein & Fox P.L.L.C.

(57) ABSTRACT

A substrate restraining system comprising: a substrate table and a plurality of circumferentially arranged restrainers each comprising a spring, wherein the spring has a proximal end and a distal end, wherein the distal end of the spring is radially displaceable, and wherein a base of the proximal end of the spring is fixed to the substrate table at a fixing location.

16 Claims, 3 Drawing Sheets

(51) Int. Cl.
　　　*G03F 7/00*　　　　(2006.01)
　　　*H01L 21/67*　　　(2006.01)
　　　*H01L 21/683*　　(2006.01)

(56) References Cited

FOREIGN PATENT DOCUMENTS

| EP | 1 096 549 A2 | 5/2001 | |
|---|---|---|---|
| JP | 2005 294654 A | 10/2005 | |
| JP | 2009272464 A * | 11/2009 | |
| WO | WO-2016172443 A1 * | 10/2016 | ....... H01L 21/68728 |
| WO | WO 2020/126963 A1 | 6/2020 | |

OTHER PUBLICATIONS

International Search Report and Written Opinion of the International Searching Authority directed to International Patent Application No. PCT/EP2022/052542, mailed May 9, 2022; 11 pages.
International Preliminary Report on Patentability directed to International Patent Application No. PCT/EP2022/052542, issued Aug. 29, 2023; 8 pages.

* cited by examiner

SUBSTRATE RESTRAINING SYSTEM

CROSS-REFERENCE TO RELATED APPLICATIONS

This application claims priority of EP application 21160262.8 which was filed on 2 Mar. 2021, and which is incorporated herein in its entirety by reference.

FIELD

The present invention relates to a substrate restraining system, and particularly to a substrate restraining system suitable for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Such lithographic apparatuses may be provided with one or more clamps to clamp the substrate to a substrate table. The clamp may be, for example, a mechanical clamp, a vacuum clamp, or an electrostatic clamp. Electrostatic clamps comprise electrodes (e.g. at least one electrode) and a plurality of burls. The burls protrude above the electrodes, such that when the electrodes are switched on, the electrodes clamp the substrate to the burls. Electrostatic clamps may be particularly suited to operating at EUV wavelengths, since regions of an EUV lithographic apparatus necessarily operate under near vacuum conditions (meaning that vacuum clamps cannot be used).

While the substrate covers an upper surface of the electrodes, the dielectric nature of the substrate prevents high voltage discharges from the switched on electrodes to adjacent modules of the lithographic apparatus. However, if the substrate is not fully covering the electrodes, an unwanted Paschen-driven electrostatic breakdown may happen, resulting in high voltage discharges from the switched on electrodes to the adjacent modules. Therefore, it may be desirable to ensure the substrate is covering the electrodes at all times the electrodes are switched on.

To prevent the substrate uncovering the switched on electrodes, a substrate restraining system may be used. The substrate restraining system comprises a plurality of restrainers operable to prevent the substrate from uncovering the electrodes by acting as a physical barrier. The substrate restraining system may make it difficult to clean the substrate table in situ because it may restrict access to parts of the substrate table. It is an object of at least one embodiment of at least one aspect of the present invention to obviate or at least mitigate at least one of the above identified shortcomings of the prior art.

SUMMARY

According to a first aspect of the invention there is provided a substrate restraining system comprising a substrate table and a plurality of circumferentially arranged restrainers each comprising a spring. The spring has a proximal end and a distal end. The distal end of the spring is radially displaceable. A base of the proximal end of the spring is fixed to the substrate table at a fixing location. The spring is operable to prevent the substrate uncovering the switched on electrodes.

Advantageously, the substrate restraining system may provide sufficient travel for the spring to enable cleaning of the substrate table (e.g. because the restrainer can be moved away from burls of the substrate table) but without the substrate being able to uncover the switched electrodes beneath the substrate. Expressed differently, the substrate restraining system solves a conflict between restraining and cleaning requirements.

The spring may be a cantilever spring. For example, the spring may be fixed at the proximal end and freely displaceable at the distal end. Having a cantilever spring may improve cleanability of the restrainer relative to for example a coil spring. This is because there are fewer regions for contaminant particles to be trapped.

The cantilever spring may have at least one bend. The spring having at least one bend may reduce a rotational force exerted on the substrate by the restrainers. For example, because the radial displacement of the spring is more closely aligned to the substrate displacement.

Each restrainer may comprise an end stop for the distal end of the spring. A radial spacing of the end stop is larger than a radial spacing of the distal end of the spring (i.e. as measured from a center of the substrate table). This enables a maximum radial displacement of the spring to be set. For example, the maximum radial displacement of the spring may be such that the substrate cannot uncover electrodes of the substrate table.

A radial displacement distance between the distal end of the spring and the end stop may be greater than or equal to 1 mm. The radial displacement distance between the distal end of the spring and the end stop may be at least 0.5 mm. The radial displacement distance between the distal end of the spring and the end stop may be less than 5 mm.

The end stop may be the base of the proximal end of the spring. Having the base also operable as the end stop may improve an ease of mounting the restrainer, compared with if the spring and the end stop were separate components. This is because accurate positioning of the spring compared to the end stop is not required. Having the base operable as the end stop may improve cleanability of the restrainer, as there are fewer components for contaminant particles to stick to.

The end stop may be provided as a separate element on the substrate table. Having the separate end stop may reduce a number of contact points between the substrate and the restrainers. This may reduce substrate contamination, as the substrate contacts fewer surfaces and therefore has fewer opportunities to become contaminated. Having the separate end stop may reduce a rotational force exerted on the substrate, as the end stop is aligned with the radial displacement direction of the spring.

The end stop may be radially deformable. The radially deformable end stop may reduce a deceleration of the substrate in an event where the end stop is used. Reducing the deceleration of the substrate may reduce damage caused to the substrate, substrate restraining system, or the lithographic apparatus compared to non-radially deformable end stops.

The spring may have a stiffness of less than or equal to 200 N/m. Having the spring stiffness less than or equal to 200 N/m may enable a cleaning stone to radially displace the spring during a cleaning step. The spring stiffness may be low enough to not generate excessive contamination particles during the cleaning step resulting from friction between an outer edge of the cleaning stone and the restrainer.

The spring may have a stiffness of greater than or equal to 50 N/m. Having the spring stiffness greater than or equal to 50 N/m may enable the spring to prevent the substrate being mis-centered and uncovering an electrode.

The plurality of restrainers may comprise three or more restrainers. Having at least three restrainers enables the substrate to be centered on the substrate table in two dimensions. A centering force may be provided from each restrainer to the substrate. Having more restrainers may enable a more consistent centering force on the substrate. For example, because for any given displacement direction of the substrate, there will be a restrainer closer to the displaced substrate direction.

Each restrainer may be formed from metal. The metal may be stainless Steel or Inconel, for example, for compatibility with EUV radiation. Where EUV radiation compatibility of the restrainers is not required, the restrainers may be formed from other materials, for example, titanium or other metal.

According to a second aspect of the invention there is provided a lithographic tool comprising the substrate restraining system of the first aspect. The lithographic tool may form part of substrate handling tool that is used in a chemical vapor deposition (CVD) apparatus, an atomic layer deposition (ALD) apparatus or other wafer (or other substrate) or mask (or other patterning device) processing apparatus. The lithographic tool may use vacuum conditions or ambient (non-vacuum) conditions.

The lithographic apparatus may comprise a cleaning stone that has a friction-reducing coating on its outer edge. During the cleaning step, an outer edge of the cleaning stone may rub against the restrainers. The friction-reducing coating may reduce contamination particles generated by the friction between the cleaning stone and the restrainers. During the cleaning step, the substrate is not present on the electrostatic clamp and the electrostatic clamp is switched off. The cleaning stone is positioned on the buds, e.g. by an actuator, and is rubbed across an upper surface of the buds to remove contamination particles.

Features mentioned above in accordance with any aspect of the present disclosure or below relating to any specific embodiment of the disclosure might be used, either alone or in combination with any other defined feature, in any other aspect or embodiment or to form a further aspect or embodiment of the disclosure.

BRIEF DESCRIPTION OF THE DRAWINGS

Embodiments of the invention will now be described, by way of example only, with reference to the accompanying schematic drawings, in which:

FIG. 2b depicts a cross-sectional view of the substrate restraining system of FIG. 2a through a diameter of the substrate restraining system of FIG. 2a;

DETAILED DESCRIPTION

Figures 1, 2A:
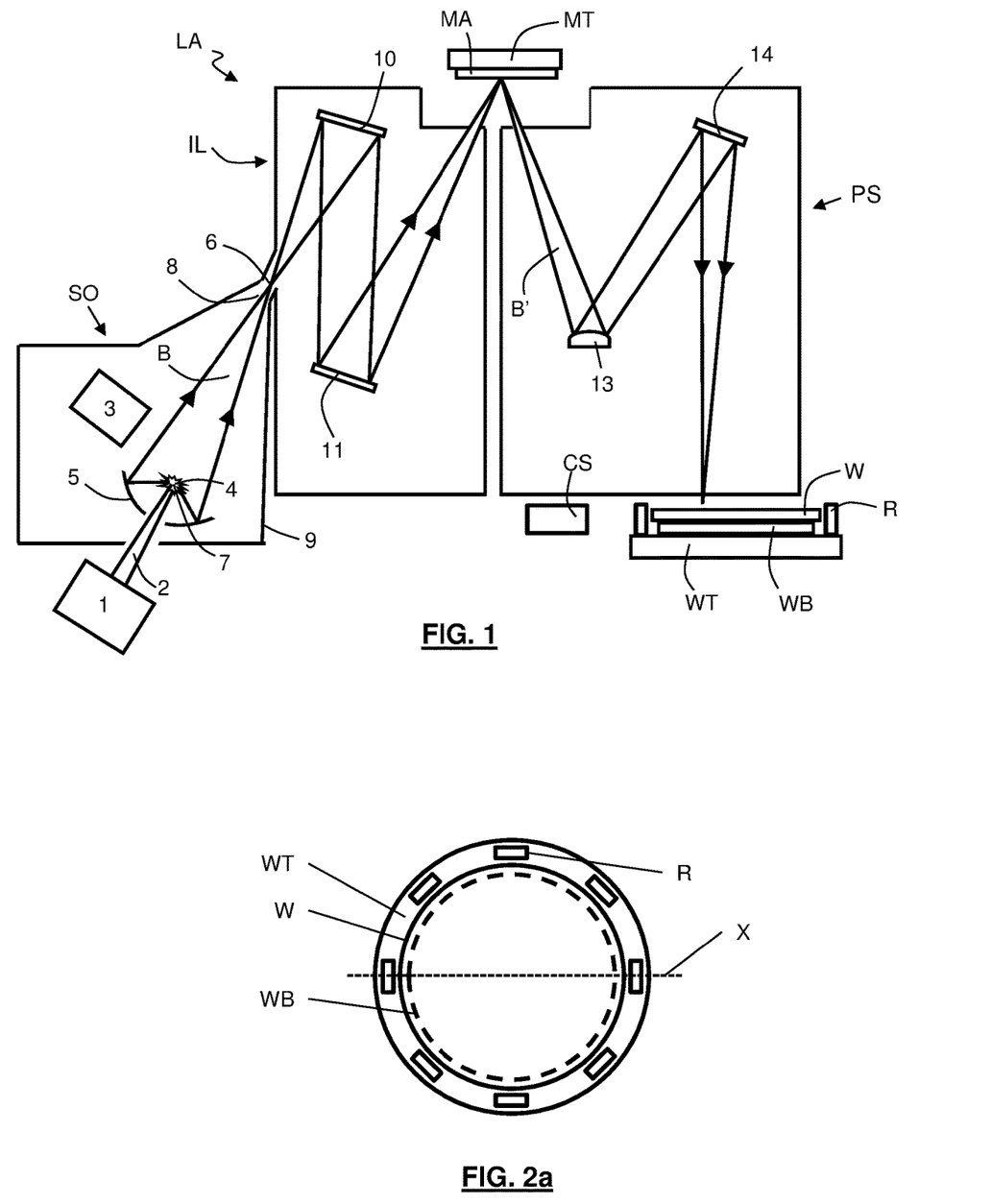
FIG. 1 depicts a lithographic system comprising a lithographic apparatus and a radiation source.
FIG. 2a depicts a top-down view of a substrate restraining system.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, a substrate table WT, and a cleaning stone CS. The substrate table WT comprises a plurality of restrainers and an electrostatic clamp WB that is operable to clamp a substrate. The electrostatic clamp WB further comprises burls (not shown) and electrodes (not shown). The burls are configured to support the substrate W. The burls may have curved upper surfaces, to reduce an area that is in contact with the substrate. The electrodes are operable to clamp the substrate W to the burls. The restrainers R are configured to prevent the substrate uncovering the electrodes. The cleaning stone CS is operable to clean the burls of the electrostatic clamp WB during a cleaning step. The cleaning stone may be cylindrical, and may have a diameter of around 50 mm. The cleaning stone may have a thickness of around 10 mm.

During the cleaning step, the substrate W is not present on the electrostatic clamp WB and the electrostatic clamp WB is switched off. The cleaning stone CS is positioned on the burls, e.g. by an actuator, and is rubbed across an upper surface of the burls to remove contamination particles. During the cleaning step, an outer edge of the cleaning stone CS may rub against the restrainers. To reduce contamination produced from friction between the outer edge of the cleaning stone and the restrainers R, the outer edge of the cleaning stone CS may be coated in a friction-reducing coating.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a CO2 laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Figure 2B:
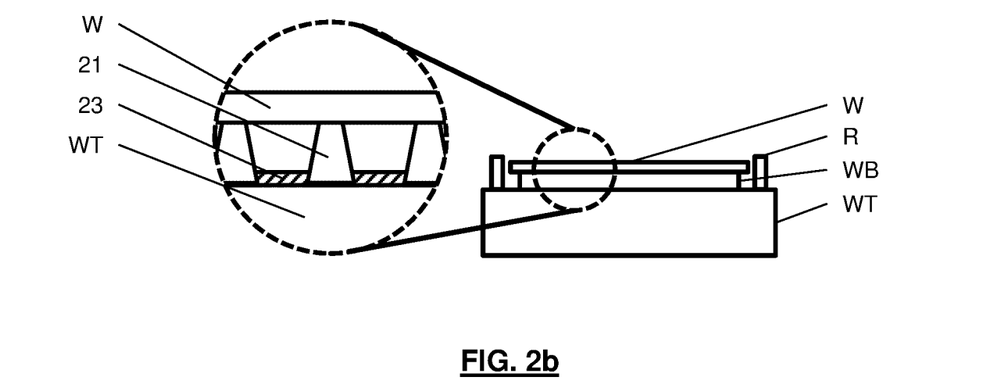

FIG. 2a shows a top-down view of a substrate restraining system. FIG. 2b shows a cross-sectional view that corresponds to the section X through the substrate restraining system of FIG. 2a.

FIGS. 2a and 2b include the substrate table WT, the plurality of restrainers R, and the electrostatic clamp WB. The electrostatic clamp comprises electrodes 23 and a plurality of burls 21, which are shown in an expanded region of FIG. 2b. The burls 21 protrude above the electrodes 23.

A substrate W is provided on the substrate table WT. A lower surface of the electrostatic clamp WB is connected to an upper surface of the substrate table WT. The substrate W is positioned such that a lower surface of the substrate W is in contact with the burls 21.

Each restrainer R comprises a spring that is operable to apply a centering force to the substrate W, if the substrate W is radially displaced towards the restrainer R from a center of the electrostatic clamp WB by more than an engagement distance. The engagement distance is a distance between the outer edge of the substrate W and a closest surface of the restrainer R.

The substrate may slide across the burls 21, for example, during a floating event. During floating events, the substrate W briefly floats on a layer of gas above the burls 21, for example, on hydrogen gas. Expressed differently, floating events briefly prevent the electrostatic clamp WB from clamping the substrate W, which may enable the substrate W to uncover the switched on electrodes 23. To prevent the substrate from uncovering the electrodes 23, the restrainers R should be within an effective restraining radius (when in a relaxed or equilibrium state). The effective restraining radius is the maximum radius from the center of the electrostatic clamp WB that is still small enough to prevent the substrate W from uncovering the electrodes 23 for any displacement of the substrate W from the center of the electrostatic clamp WB. To prevent the substrate W from uncovering the electrodes 23, the restrainers R provide a physical barrier to an outer edge of the substrate W.

Particles that may be present on the substrate W may be received on the burls (although most will fall between the burls). This will cause unwanted so-called sticking effects between the burls and the substrate W. These particles are removed during a cleaning step. The cleaning step may use the cleaning stone CS to remove particles from the burls 21. During the cleaning step, the cleaning stone CS may move across an edge of the electrostatic clamp WB, which may require that there are no obstructions, e.g. restrainers R, within an effective cleaning radius.

The effective cleaning radius may be larger than the effective restraining radius. Expressed differently, there is a conflict in the restraining and cleaning requirements for the substrate restraining system, which is addressed by embodiments of the invention.

The substrate table WT, electrostatic clamp WB, and substrate W are shown as axially aligned disks. The substrate table WT has a larger radius than the substrate W. The substrate W has a larger radius than the electrostatic clamp WB. The plurality of restrainers R are circumferentially arranged to surround the substrate W.

Each restrainer R is arranged such that its engagement distance is greater than zero but small enough that the substrate is kept within the effective restraining radius. If the substrate W is radially displaced towards the restrainer R from the center of the electrostatic clamp WB by at least the engagement distance (e.g. during a floating event), the outer edge of the substrate W will contact the restrainer R. The restrainer R that the substrate W contacts will displace outwardly due to the spring nature of the restrainer R and will apply a centering force on the substrate W.

The spring stiffness may be operable to apply a centering force to the substrate W great enough to prevent the substrate W from uncovering the electrodes 23. Alternatively, the spring stiffness may be operable to apply a centering force to the substrate W great enough to decelerate the substrate W before a maximum displacement of the spring, wherein the maximum displacement of the spring is limited by an end stop. The end stop may apply the centering force directly on the substrate W. The end stop may apply the centering force on the spring, which applies the centering force on the substrate W. Decelerating the substrate W before the maximum displacement of the spring may reduce damage caused to the substrate W, substrate restraining system, or the lithographic apparatus compared to restrainers R that do not comprise springs.

The spring stiffness is low enough that during the cleaning step, the cleaning stone CS is able to displace the restrainer R to clean the entire surface of the electrostatic clamp WB.

The spring stiffness is low enough not to generate excessive contamination particles during the cleaning step resulting from friction between an outer edge of the cleaning stone CS and the restrainer R.

The substrate W radius may be 150 mm (i.e. a diameter of 300 mm). The substrate W thickness may be 1.0±0.1 mm. The outermost burls may be positioned at a radius of at least 145 mm, the radius being measured from a center of the electrostatic clamp. The outermost burls may be positioned at a radius of up to 149 mm. The engagement distance between the outer edge of the substrate W and the closest surface of the restrainer R may be at least 1 mm. The spring may be radially displaceable from its equilibrium position by at least 0.5 mm. The spring may be radially displaceable from its equilibrium position by up to 5 mm.

The restrainers R may enable accurate centering of the substrate on the substrate table and also allow for the outermost burls to be cleaned (e.g. by the cleaning stone during the cleaning step). This in turn may enable a maximum outer radius of the clamp electrodes 23 to be increased without increasing a risk of the electrodes 23 becoming uncovered. For example, the maximum outer radial extent of the electrodes 23 may be increased from around 146 mm) to around 148 mm.

The restrainers R extend substantially vertically from the substrate table WT. An upper surface of the restrainers R may be high enough compared to a centerline of the substrate W, for example a 1 mm thickness substrate W, to prevent the substrate W sliding over the upper surface of the restrainers R. For example, the upper surface of the restrainers R may be higher than or equal to 0.4 mm above an upper surface of the burls and usually higher than or equal to 0.5 mm above an upper surface of the burls.

The upper surface of the restrainers R may be lower than an upper surface of the substrate W, for example, the 1 mm thickness substrate W. The upper surface of the restrainers R may be lower than or equal to 0.8 mm above the upper surface of the burls. This may prevent the restrainers R from colliding with adjacent modules to the substrate table WT within the lithographic apparatus.

Although FIG. 2a depicts eight restrainers R, any number of restrainers R that is greater than or equal to three may be used. Having at least three restrainers R enables the substrate to be centered on the substrate table in two dimensions.

The restrainers R may be formed from a metal such as stainless Steel or Inconel, for example, for compatibility with EUV radiation. Where EUV radiation compatibility of the restrainers R is not required, the restrainers may be formed from other materials, for example, titanium or other metal.

Figure 3:
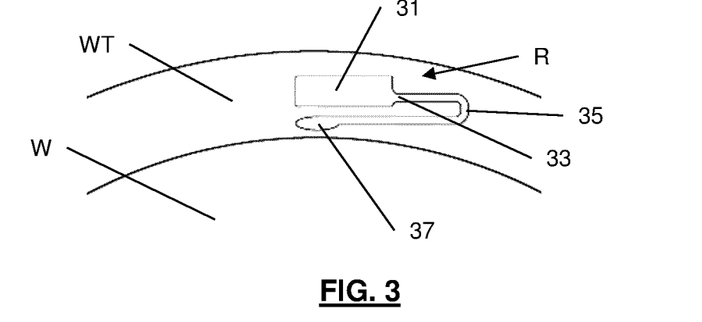
FIG. 3 depicts a top-down view of the restrainer of the substrate restraining system of FIG. 2.

FIG. 3 shows a top-down view of a restrainer R of a substrate restraining system. For example, the restrainer R of FIG. 3 may be used in the substrate restraining system of FIG. 2. The restrainer R comprises a spring 35. The spring 35 has a proximal end 33 and a distal end 37. The distal end 37 of the spring 35 is radially displaceable, for example, if the substrate W were press against the distal end 37 of the spring 35.

The proximal end 33 of the spring 35 connects to a base 31. The base 31 is fixed to the upper surface of the substrate table WT at a fixing location that is underneath the base 31. A length of the base 31 may be greater than or equal to 20 mm. A width of the base 31 may be greater than or equal to 20 mm. An area of the base 31 may be greater than or equal to 400 mm$^2$. For example, so that an adhesive coating the area of the base 31 is strong enough to resist a maximum applied load to the restrainer R (as explained further below).

The length of the base 31 may be smaller than or equal to 50 mm. The width of the base 31 may be smaller than or equal to 50 mm. The area of the base 31 may be smaller than or equal to 2500 mm$^2$. For example, so that the base 31 is small enough to fit within limited space on the substrate table WT.

Figure 4:
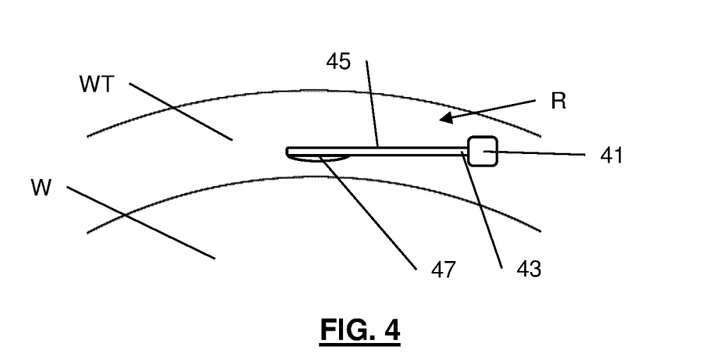
FIG. 4 depicts a top-down view of a first alternative restrainer of the substrate restraining system of FIG. 2.
Figure 5:
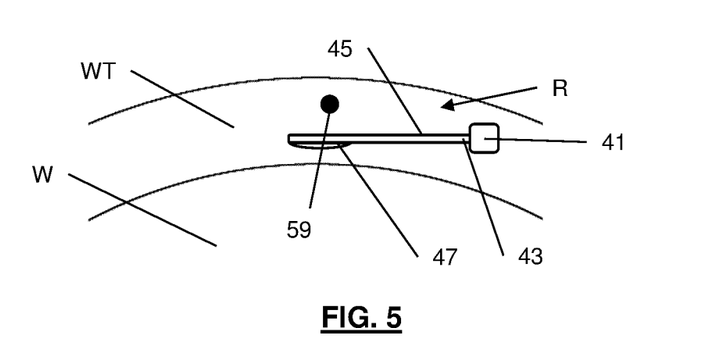
FIG. 5 depicts a top-down view of a second alternative restrainer of the substrate restraining system of FIG. 2.

These length, width, and area dimensions may also apply to the base 31 of other embodiments in this disclosure, as described in FIGS. 4 and 5.

The fixing location is positioned on a radial line that extends from the center of the electrostatic clamp WB through the base 31.

The spring 35 is a cantilever spring having one bend. The spring 35 is generally U-shaped. The spring 35 is arranged to extend from the base 31 in a first direction that is perpendicular (i.e. transverse) to the radial line before the spring 35 bends back on itself and extends along a second direction that is antiparallel with the first direction. Because of the bend, the distal end 37 of the spring 35 and the proximal end 33 of the spring 35 are closer together than a length of the spring 35.

During radial displacement of the distal end 37 of the spring 35, the base 31 is operable as an end stop 31 to prevent radial displacement of the distal end 37 of the spring 35 that is greater than a desired maximum displacement. The desired maximum displacement may be at least 0.5 mm. The desired maximum displacement may be less than 5 mm. For example, the desired maximum displacement may be 1 mm.

Having the base 31 also operable as the end stop 31 may improve an ease of mounting the restrainer R, compared with if the spring 35 and the end stop 31 were separate components. This is because accurate positioning of the spring 35 compared to the end stop 31 is not required.

The maximum applied load may occur during end stop 31 loading with the cleaning stone CS. Expressed differently, the maximum applied load may occur once the spring 35 is maximally displaced (i.e. at the end stop 31) and the end stop 31 is preventing the cleaning stone CS from further radial displacement. The end stop 31 and the adhesive that fixes the area of the base 31 to the substrate table WT may be strong enough to resist the maximum applied force.

A thickness of the spring 35 is selected such that the spring deforms elastically, while providing a required stiffness. The required stiffness may be at least 50 N/m. The required stiffness may be less than or equal to 200 N/m. The spring stiffness may be 100±10 N/m.

The distal end 37 of the spring 35 is shaped such that the substrate W only contacts a small area of the distal end 37. For example, the distal end 37 of the spring 35 may comprise a surface that is convex in a plane parallel to the substrate table WT. The distal end may comprise a surface that is convex in a direction which faces towards an inner part of the substrate table WT. The convex shape may decrease friction between the substrate W and the distal end 37 of the spring 35. For example, to generate fewer contaminant particles, because the surface area of contact between the spring and the substrate is reduced (compared with a flat or concave surface).

Although one bend is referred to, the spring may have any number of bends. The bends may be U-shaped or the bends may be less tight than U-shaped. Bends that are less tight than U-shaped may increase maximum displacement of the distal end 33 of the spring 35 compared to U-shaped bends.

The restrainer R may comprise only curved surfaces. Expressed differently, in an embodiment the restrainer R has no sharp edges. Cleanability may be improved for the restrainer R having curved surfaces, as sharp edges may provide corners from which contamination particles cannot be removed (or are more difficult to remove).

FIG. 4 shows a top-down view of a first alternative restrainer R of a substrate restraining system. For example, the restrainer R of FIG. 4 may be used in the substrate restraining system of FIGS. 2a and 2b. The restrainer R comprises a spring 45. The spring 45 has a proximal end 43 and a distal end 47. The distal end 47 of the spring 45 is radially displaceable, for example, if the substrate W were to press against the distal end 47 of the spring 45.

The proximal end 43 of the spring 45 connects to a base 41. The base 41 is fixed to the upper surface of the substrate table WT at a fixing location that is underneath the base 41. The fixing location is positioned on a radial line that extends from the center of the electrostatic clamp WB through the base 31.

The base 41 may be operable as an end stop 41. During radial displacement of the distal end 47 of the spring 45, the end stop 41 may be operable to prevent radial displacement of the substrate W that is greater than the desired maximum displacement. The desired maximum displacement may be at least 0.5 mm. The desired maximum displacement may be less than 5 mm. For example, the desired maximum displacement may be 1 mm.

The maximum applied load may occur during end stop 41 loading with the cleaning stone CS. Expressed differently, the maximum applied load may occur once the spring 45 is maximally displaced (i.e. at the end stop 41) and the end stop 41 is preventing the cleaning stone CS from further radial displacement. The end stop 41 and the adhesive that fixes the area of the base 41 to the substrate table WT may be strong enough to resist the maximum applied force.

The spring 45 is a flat cantilever spring. The spring 45 is arranged to extend from the base 31 in a direction that is perpendicular (i.e. transverse) to the radial line. The length of the spring 45 and the distance between the distal end 47 and the proximal end 43 of the spring 45 may be up to 10 mm. The length of the spring 45 and the distance between the distal end 47 and the proximal end 43 of the spring 45 may be at least 2 mm.

Use of a flat cantilever spring may improve cleanability of the restrainer R. For example, because there are fewer regions for contaminant particles to be trapped. Conversely, an inside area of a U-shaped spring may be difficult to clean contaminant particles from. Having the base 41 operable as the end stop may improve cleanability of the restrainer R, as there are fewer components for contaminant particles to stick to.

A thickness of the spring 45 is selected such that the spring deforms elastically, while providing a required stiffness. The required stiffness may be at least 50 N/m. The required stiffness may be less than or equal to 200 N/m. In particular, the spring stiffness may be 100±10 N/m.

The distal end 47 of the spring 45 is shaped such that the substrate W only contacts a small area of the distal end 47. For example, the distal end 47 of the spring 45 may comprise a surface that is convex in a plane parallel to the substrate table WT. The distal end may comprise a surface that is convex in a direction which faces towards an inner part of the substrate table WT. The convex shape may decrease friction between the substrate W and the distal end 47 of the spring 45. For example, to generate fewer contaminant particles, because the surface area of contact between the spring and the substrate is reduced (compared with a flat or concave surface).

The restrainer R comprises only curved surfaces. Expressed differently, the restrainer R has no sharp edges. Cleanability may be improved for the restrainer R having curved surfaces, as sharp edges may provide corners from which contamination particles cannot be removed (or are more difficult to remove).

FIG. 5 shows a top-down view of a second alternative restrainer R of a substrate restraining system. For example, the restrainer R of FIG. 5 may be used in the substrate restraining system of FIGS. 2a and 2b. FIG. 5 is identical to FIG. 4, except that the substrate table WT of FIG. 5 also comprises a separate end stop 59 (i.e. the end stop is formed as a separate element).

The end stop 59 may be a rounded column that protrudes vertically upwards from the upper surface of substrate table WT. The end stop 59 may be cylindrical, a rounded cuboid, or another rounded shape. Having the end stop 59 be rounded may reduce contact stress between the end stop and the spring. Having the end stop be rounded may reduce generation of contamination particles. Having the end stop 59 be rounded may improve cleanability, for example, because there are fewer regions in which contaminant particles could be trapped.

A length of the end stop 59 may be greater than or equal to 20 mm. A width of the end stop 59 may be greater than or equal to 20 mm. An area of the end stop 59 may be greater than or equal to 400 mm$^2$. For example, so that an adhesive coating the area of the end stop 59 is strong enough to resist a maximum applied load to the restrainer R.

The length of the end stop 59 may be smaller than or equal to 50 mm. The width of the end stop 59 may be smaller than or equal to 50 mm. The area of the end stop 59 may be smaller than or equal to 2500 mm$^2$. For example, so that the end stop 59 is small enough to fit within limited space on the substrate table WT.

The maximum applied load may occur during end stop 59 loading with the cleaning stone CS. Expressed differently, the maximum applied load may occur once the spring 45 is maximally displaced (i.e. at the end stop 59) and the end stop 59 is preventing the cleaning stone CS from further radial displacement. The end stop 59 and the adhesive that fixes the area of the end stop 59 to the substrate table WT may be strong enough to resist the maximum applied force.

In this embodiment, the separate end stop 59 resists the maximum applied load and not the base 41. Therefore, the area of the base 41 may be smaller than in the embodiments of FIGS. 3 and 4. For example, the base 41 only has to be large enough that the adhesive fixing the area of the base 41 to the substrate table WT is strong enough to resist a force exerted on the base 41 by the spring 45 and not by the maximally displaced cleaning stone CS.

During radial displacement of the distal end 47 of the spring 45, the end stop 59 is operable to prevent radial displacement of the distal end 47 of the spring 45 that is greater than the desired maximum displacement. The desired maximum displacement may be at least 0.5 mm. The desired maximum displacement may be less than 5 mm. For example, the desired maximum displacement may be 1 mm.

Having the separate end stop 59 may reduce a number of contact points between the substrate W and the restrainers. This may reduce substrate contamination, as the substrate W contacts fewer surfaces and therefore has fewer opportunities to become contaminated. Having the separate end stop 59 may reduce a rotational force exerted on the substrate W, as the end stop is aligned with the radial displacement direction of the spring.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). Embodiments of the invention may form part of a substrate handling tool that is used in a chemical vapor deposition (CVD) apparatus, an atomic layer deposition (ALD) apparatus or other wafer (or other substrate) or mask (or other patterning device) processing apparatus. These apparatuses may be generally referred to as lithographic tools or semiconductor manufacturing apparatus. Such tools may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A substrate restraining system comprising:
   a substrate table comprising burls configured to support a substrate and a plurality of circumferentially arranged restrainers each comprising a spring;
   wherein the spring of each restrainer has a proximal end and a distal end;
   wherein the distal end of each spring is radially displaced from an outer edge of the substrate and only contacts the outer edge of the substrate to provide a physical barrier to restrain radial displacement of the substrate without immobilizing the substrate; and
   wherein a base of the proximal end of the spring is fixed to the substrate table at a fixing location.

2. The substrate restraining system of claim 1, wherein the spring is a cantilever spring.

3. The substrate restraining system of claim 2, wherein the cantilever spring has at least one bend.

4. The substrate restraining system of claim 1, wherein:
   each of the restrainers comprises an end stop for the distal end of the spring; and
   a radial spacing of the end stop is larger than a radial spacing of the distal end of the spring.

5. The substrate restraining system of claim 4, wherein a radial displacement distance between the distal end of the spring and the end stop is greater than or equal to 1 mm.

6. The substrate restraining system of claim 4, wherein the end stop is the base of the proximal end of the spring.

7. The substrate restraining system of claim 4, wherein the end stop is provided as a separate element on the substrate table.

8. The substrate restraining system of claim 4, wherein the end stop is radially deformable.

9. The substrate restraining system of claim 1, wherein the spring has a stiffness of less than or equal to 200 N/m.

10. The substrate restraining system of claim 1, wherein the spring has a stiffness of greater than or equal to 50 N/m.

11. The substrate restraining system of claim 1, wherein the restrainers comprise three or more restrainers.

12. The substrate restraining system of claim 1, wherein each of the restrainers is formed from metal.

13. An apparatus comprising the substrate restraining system of claim 1.

14. The apparatus of claim 13, further comprising a cleaning stone.

15. The apparatus of claim 14, wherein an outer edge of the cleaning stone comprises a friction-reducing coating.

16. The substrate restraining system of claim 1, wherein:
   the restrainers extend substantially vertically from the substrate table; and
   an upper surface of the restrainers is higher than or equal to 0.4 mm and lower than or equal to 0.8 mm above an upper surface of the burl.

* * * * *